(12) United States Patent
Hayashi et al.

(10) Patent No.: US 9,065,074 B2
(45) Date of Patent: Jun. 23, 2015

(54) ELECTRO-OPTICAL DEVICE AND ELECTRONIC APPARATUS

(71) Applicant: SEIKO EPSON CORPORATION, Tokyo (JP)

(72) Inventors: Kenji Hayashi, Suwa (JP); Mitsuru Kuribayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/294,811

(22) Filed: Jun. 3, 2014

(65) Prior Publication Data

US 2015/0028304 A1 Jan. 29, 2015

Related U.S. Application Data

(60) Continuation of application No. 12/461,110, filed on Jul. 31, 2009, now Pat. No. 8,779,658, which is a division of application No. 11/798,743, filed on May 16, 2007, now abandoned, which is a continuation of application No. 10/691,671, filed on Oct. 24, 2003, now Pat. No. 7,242,375.

(30) Foreign Application Priority Data

Oct. 25, 2002 (JP) .................................. 2002-311109

(51) Int. Cl.
*H01L 51/52* (2006.01)
*H01L 27/32* (2006.01)
(52) U.S. Cl.
CPC ......... *H01L 51/5253* (2013.01); *H01L 27/3244* (2013.01); *H01L 51/5203* (2013.01); *H01L 51/5237* (2013.01); *H01L 27/32* (2013.01)

(58) Field of Classification Search
USPC ...................... 313/504, 512, 506, 509; 345/76
See application file for complete search history.

(56) References Cited

U.S. PATENT DOCUMENTS

| 4,068,923 A | 1/1978 | Toida |
| 5,909,081 A | 6/1999 | Eida et al. |

(Continued)

FOREIGN PATENT DOCUMENTS

| CN | 1207194 A | 2/1999 |
| CN | 1291792 A | 4/2001 |

(Continued)

OTHER PUBLICATIONS

Oct. 31, 2011 Office Action issued in U.S. Appl. No. 12/379,184.

(Continued)

*Primary Examiner* — Thomas A Hollweg
(74) *Attorney, Agent, or Firm* — Oliff PLC

(57) ABSTRACT

The invention provides an electro-optical device that has luminescent elements of a long lifetime by preventing oxygen or moisture from entering to luminescent layers or electrodes even in case of an electrode-optical device provided with a number of luminescent layers and an electronic apparatus provided with the electro-optical device. The invention can include an electro-optical device having first electrodes on a base body, a plurality of element areas including element layers including at least one functional layers disposed above the first electrodes, a second electrode formed above the element layers, a surrounding sections disposed on the base body so as to cover outer sides of the element layers included the element areas in the nearest proximity of the periphery of the base body, and a gas-barrier layer covering over the second electrode. Outer sides of the surrounding sections can be covered with the second electrode, and the gas-barrier layer can be in contact with the base body.

19 Claims, 13 Drawing Sheets

(56) References Cited

U.S. PATENT DOCUMENTS

| | | |
|---|---|---|
| 6,127,199 A | 10/2000 | Inoue et al. |
| 6,198,220 B1 | 3/2001 | Jones et al. |
| 6,225,969 B1 | 5/2001 | Ishii |
| 6,359,606 B1 | 3/2002 | Yudasaka |
| 6,388,377 B1 | 5/2002 | Kobayashi et al. |
| 6,413,645 B1 | 7/2002 | Graff et al. |
| 6,480,181 B2 | 11/2002 | Ishii |
| 6,559,905 B1 | 5/2003 | Akiyama |
| 6,664,732 B2 | 12/2003 | Yamazaki et al. |
| RE38,466 E | 3/2004 | Inoue et al. |
| 6,739,931 B2 | 5/2004 | Yamazaki et al. |
| 6,784,459 B2 | 8/2004 | Seki et al. |
| 6,803,898 B2 | 10/2004 | Ishii |
| 6,806,918 B2 | 10/2004 | Akiyama |
| 6,821,553 B2 | 11/2004 | Miyashita et al. |
| 6,829,023 B2 | 12/2004 | Goto |
| 6,833,156 B2 | 12/2004 | Miyashita et al. |
| 6,833,668 B1 | 12/2004 | Yamada et al. |
| 6,838,192 B2 | 1/2005 | Miyashita et al. |
| 6,841,932 B2 | 1/2005 | Aziz et al. |
| 6,863,961 B2 | 3/2005 | Miyashita et al. |
| 6,924,593 B2 | 8/2005 | Seki et al. |
| 6,924,594 B2 | 8/2005 | Ogura et al. |
| 7,026,757 B1 | 4/2006 | Kobayashi |
| 7,050,125 B2 | 5/2006 | Akiyama |
| 7,061,176 B2 | 6/2006 | Kobayashi |
| 7,075,106 B2 | 7/2006 | Shibata et al. |
| 7,186,581 B2 | 3/2007 | Seki et al. |
| 7,242,375 B2 | 7/2007 | Hayashi et al. |
| 7,301,277 B2 | 11/2007 | Hayashi |
| RE40,601 E | 12/2008 | Inoue et al. |
| 7,473,928 B1 | 1/2009 | Yamazaki et al. |
| 7,521,722 B2 | 4/2009 | Yamazaki et al. |
| 7,548,023 B2 | 6/2009 | Yamazaki et al. |
| 2001/0026125 A1 | 10/2001 | Yamazaki et al. |
| 2001/0031379 A1 | 10/2001 | Tera et al. |
| 2001/0054867 A1 | 12/2001 | Kubota et al. |
| 2002/0030443 A1 | 3/2002 | Konuma et al. |
| 2002/0033664 A1 | 3/2002 | Kobayashi |
| 2002/0044111 A1 | 4/2002 | Yamazaki et al. |
| 2002/0045066 A1 | 4/2002 | Beierlein et al. |
| 2002/0057051 A1 | 5/2002 | Kobayashi |
| 2002/0057055 A1 | 5/2002 | Yamazaki et al. |
| 2002/0064966 A1 | 5/2002 | Seki et al. |
| 2002/0070663 A1 | 6/2002 | Ogura et al. |
| 2002/0136823 A1 | 9/2002 | Miyashita et al. |
| 2002/0158588 A1 | 10/2002 | Hayashi et al. |
| 2003/0193286 A1 | 10/2003 | Ottermann et al. |
| 2003/0218422 A1 | 11/2003 | Park et al. |
| 2004/0119403 A1 | 6/2004 | McCormick et al. |
| 2004/0248386 A1 | 12/2004 | Nishitani et al. |
| 2005/0042477 A1 | 2/2005 | Miyashita et al. |
| 2005/0098113 A1 | 5/2005 | Hayashi |
| 2005/0264186 A1 | 12/2005 | Seki et al. |
| 2005/0264187 A1 | 12/2005 | Seki et al. |
| 2006/0180826 A1 | 8/2006 | Yamazaki et al. |
| 2007/0018152 A1 | 1/2007 | Seki et al. |
| 2007/0224907 A1 | 9/2007 | Hayashi et al. |
| 2008/0042562 A1 | 2/2008 | Hayashi |
| 2009/0109143 A1 | 4/2009 | Yamazaki et al. |
| 2009/0269871 A1 | 10/2009 | Yamazaki et al. |

FOREIGN PATENT DOCUMENTS

| | | |
|---|---|---|
| EP | 1 087 366 A2 | 3/2001 |
| EP | 1 109 225 A2 | 6/2001 |
| EP | 1 139 325 A1 | 10/2001 |
| JP | A-01-283937 | 11/1989 |
| JP | A-08-111286 | 4/1996 |
| JP | A-08-279394 | 10/1996 |
| JP | A-09-123334 | 5/1997 |
| JP | A-10-125931 | 5/1998 |
| JP | A-10-153967 | 6/1998 |
| JP | A-10-289784 | 10/1998 |
| JP | A-2000-100572 | 4/2000 |
| JP | A-2000-150147 | 5/2000 |
| JP | A-2000-173766 | 6/2000 |
| JP | A-2000-208254 | 7/2000 |
| JP | A-2001-007340 | 1/2001 |
| JP | A-2001-189192 | 7/2001 |
| JP | A-2001-284041 | 10/2001 |
| JP | A-2001-326069 | 11/2001 |
| JP | A-2001-338754 | 12/2001 |
| JP | A-2001-345174 | 12/2001 |
| JP | A-2002-018246 | 1/2002 |
| JP | A-2002-025765 | 1/2002 |
| JP | A-2002-049333 | 2/2002 |
| JP | A-2002-164165 | 6/2002 |
| JP | A-2002-164181 | 6/2002 |
| JP | A-2002-184569 | 6/2002 |
| JP | A-2002-203861 | 7/2002 |
| JP | A-2002-208491 | 7/2002 |
| JP | A-2002-252083 | 9/2002 |
| JP | A-2002-268048 | 9/2002 |
| JP | A-2002-299044 | 10/2002 |
| JP | A-2003-142255 | 5/2003 |
| JP | A-2003-142274 | 5/2003 |
| JP | A-2004-146244 | 5/2004 |

OTHER PUBLICATIONS

Sep. 8, 2010 Chinese Office Action issued in Chinese Patent Application No. 200910164425.5 (with translation).
Sep. 18, 2013 Office Action issued in U.S. Appl. No. 12/461,110.
Oct. 16, 2012 Office Action issued in U.S. Appl. No. 12/461,110.
Mar. 2, 2012 Office Action issued in U.S. Appl. No. 12/461,110.
Oct. 6, 2011 Office Action issued in U.S. Appl. No. 12/461,110.
May 19, 2011 Office Action issued in U.S. Appl. No. 12/461,110.
Dec. 21, 2010 Office Action issued in U.S. Appl. No. 12/461,110.

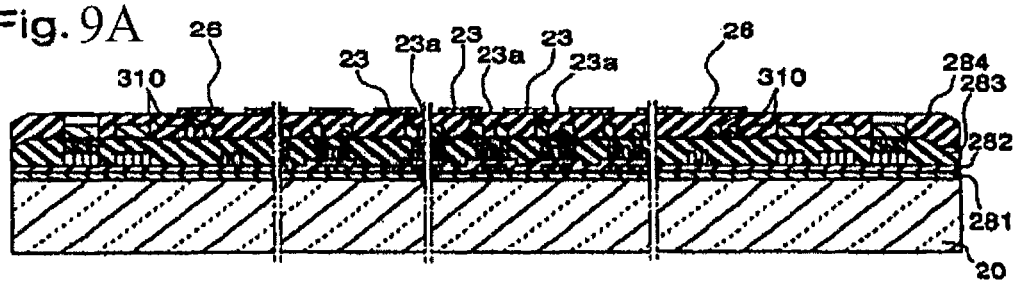
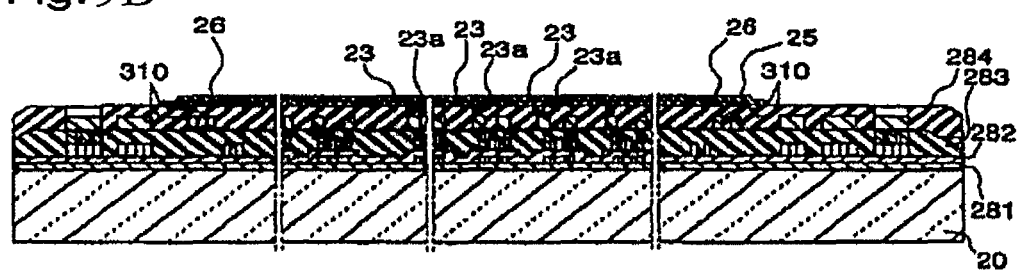
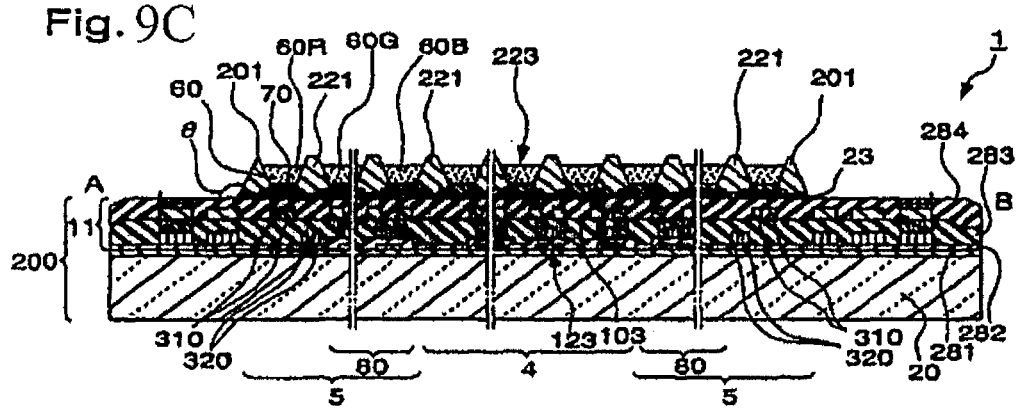

ELECTRO-OPTICAL DEVICE AND ELECTRONIC APPARATUS

This application is a Continuation of application Ser. No. 12/461,110, filed Jul. 31, 2009 which is turn is a Divisional of application Ser. No. 11/798,743, filed May 16, 2007, which in turn is a Continuation of application Ser. No. 10/691,671 filed Oct. 24, 2003, which claims priority to Japanese Patent Application No. 2002-311109, filed Oct. 25, 2002. The entire disclosure of the prior applications are hereby incorporated by reference herein in their entirety.

BACKGROUND OF THE INVENTION

1. Technical Field of Invention

The present invention relates to an electro-optical device and electronic apparatus provided with the electro-optical device.

2. Description of Related Art

Hitherto, an electro-optical device is known that includes an organic electroluminescent (organic EL) display that has laminated structure composed of anodes, hole injection layers, luminescent layers made of an electro-optical material such as an EL material, and cathodes on a substrate. Organic electroluminescent elements constituting the organic EL display have problems in which the life time of the organic EL elements are shortened by the deterioration of a electro-optical material constructing the luminescent layer and the decrease of conductivity of cathodes, due to oxygen or moisture.

SUMMARY OF THE INVENTION

As a typical technique for solving the problems, for example, a method for manufacturing organic EL elements including protective layers that covers luminescent layers or cathodes are known. (For example, referring to Japanese Unexamined Patent Application No. 8-111286 (FIG. 1).

In the method for manufacturing the organic EL elements, however, the case of organic EL elements having a plurality of luminescent layers is not described. This method is difficult to apply for an electro-optical device provided with the display having a plurality of the organic EL elements. Therefore, prolonging the lifetime of a plurality of the luminescent elements (organic EL elements) included in the electro-optical device can be difficult.

The present invention is achieved in view of at least the above-mentioned problems, an object of the present invention can be to provide an electro-optical device that has a long lifetime of luminescent elements by surely and easily preventing oxygen or moisture from entering to luminescent layers or electrodes and an electronic apparatus provided with the electro-optical device.

To achieve the object, an electro-optical device can include first electrodes on a base body, a plurality of element areas including element layers having at least one functional layers disposed above the first electrodes, a second electrode formed above the element layers, a surrounding sections disposed on the base body so as to cover outer sides of the element layers included the element areas in the nearest proximity of the periphery of the base body, and a gas-barrier layer covering over the second electrode, wherein outer sides of the surrounding sections are covered with the second electrode, and the gas-barrier layer is in contact with the base body.

According to the electro-optical device, surrounding sections can be formed so as to cover outer faces of peripheries of element layers included in element areas. The outer faces of the surrounding sections are covered with second electrode. The second electrode is covered with gas-barrier layers. Particularly, the outer faces of the peripheries of the element layers included in element areas are triply sealed by the surrounding sections, the second electrode, and the gas-barrier layer; hence, these layers surely prevents oxygen or moisture from entering luminescent layers to block the deterioration of the electrodes and the element layers due to oxygen or moisture. Thus, the lifetime of the luminescent elements is prolonged.

The second electrode or the gas-barrier layer are not needed for forming each element layer (for example, the luminescent layers). Hence, fine patterning is not required, and a simple method for forming films may be performed to increase productivity.

According to the electro-optical device, the element layers function by carriers supplied from the first electrodes or the second electrode and passing through the element layers. When the carriers pass through the element layers, at least part of the element layers has the different probability of presence of electrons and holes, hence, the positive and negative charges in the area may be out of balance. Material that resides in the area has generally high reactivity, for example, reacts with oxygen or moisture to form defects in the area. The defective area becomes carriers-capturing site to impair the function of the element layers. The element layers need to be sufficiently protected from the deterioration factor such as oxygen or moisture and are protected against oxygen or moisture by the surrounding sections or the gas-barrier layers.

Carrier-injection efficiency is significantly affected by the state of electrodes, hence, the electrodes need to be protected against the deterioration factor such as oxygen or moisture in order to appropriately maintain the carrier-injection efficiency. As described above, the electrodes are also protected against oxygen or moisture by the surrounding sections or the gas-barrier layers.

In the electro-optical device, the gas-barrier layer is preferably composed of an inorganic compound or a silicon compound.

In the case of the second electrode composed of, for example, an inorganic oxide such as indium tin oxide (ITO), a metal or an alloy, since the gas-barrier layer is composed of an inorganic compound or a silicon compound, the second electrode has excellent adhesion to the gas-barrier layer. Thus, the gas-barrier layer becomes a defect-free and dense layer that have an improved barrier property against oxygen or moisture.

According to the electro-optical device, at least the face in contact with the gas-barrier layer of the second electrode is preferably composed of an inorganic oxide.

In this case, the second electrode has excellent adhesion to gas-barrier layer composed of an inorganic compound or a silicon compound to allow the gas-barrier layer to become defect-free and dense layer that have an improved barrier property against oxygen or moisture.

According to the electro-optical device, an angle defined by the outer faces of the surrounding sections and the base body is preferably 110° or more. In this case, the second electrode that covers the outer faces of the surrounding sections and gas-barrier layer have excellent step coverage; hence, the second electrode and the gas-barrier layer on the outer faces have high continuity.

According to the electro-optical device, the electro-optical device is preferably an active matrix electro-optical device.

The second electrode is not necessary for each luminescent layer, hence, fine patterning is not required, and a simple method for forming films may be performed to form the second electrode to increase productivity.

According to the electro-optical device, the gas-barrier layer preferably has an oxygen concentration which is lower at a face adjacent to the second electrode than at the upper face. In this case, this structure can prevent oxygen in the gas-barrier layer from moving through the second electrode toward the luminescent layers; and deteriorating the luminescent layer. Therefore, this structure can prolong the life of the luminescent layers.

According to the electro-optical device, a protective layer on the gas-barrier layer preferably covers the gas-barrier layer. In this case, the luminescent layers or the electrodes are protected by the protective layer to block the deterioration of the luminescent layers and electrodes due to oxygen and moisture. Thus, the lifetime of the luminescent layers is prolonged.

According to the electro-optical device, the protective layer preferably includes a surface-protective sublayer on the surface of the protective layer. In this case, the surface-protective layer having functions that are, for example, pressure resistance, wear resistance, anti-reflectivity for light, a gas-barrier property, and an ultraviolet blocking property is formed; hence, the luminescent layers, the electrodes, and gas-barrier layer are protected by the surface-protective layer to prolong the lifetime of the luminescent layers.

According to the electro-optical device, the protective layer is preferably provided with a buffer layer that adheres to the gas-barrier layer and has a buffer function against mechanical shock on the gas-barrier layer side. In this case, the buffer layer absorbs the mechanical shock to the gas-barrier layer and the luminescent elements below the gas-barrier layer and can prevent the gas-barrier layer and the luminescent layers from deteriorating by the mechanical shock.

The buffer layer preferably includes silane coupling agents or alkoxysilane. In this case, the adhesion between the buffer layer and the gas-barrier layer is improved; hence, a buffer function against mechanical shock is improved.

The electronic apparatus according to the present invention can be provided with the electro-optical device. Such electronic apparatus that is provided with the electro-optical device including the luminescent elements that have a prolonged lifetime by blocking the deterioration of the luminescent layers and the electrodes due to oxygen or moisture, hence, the electronic apparatus has a prolonged lifetime.

BRIEF DESCRIPTION OF THE DRAWINGS

The invention will be described with reference to the accompanying drawings, wherein like numerals reference like elements, and wherein:

FIGS. 9A to 9C are cross-sectional views describing processes following FIGS. 8A to 8C;

DETAILED DESCRIPTION OF PREFERRED EMBODIMENTS

According to an embodiment of an electro-optical device of the present invention, an electroluminescent (EL) display including of an EL material as an example of an electro-optical material, in particular, an organic EL material is described.

Figure 1:
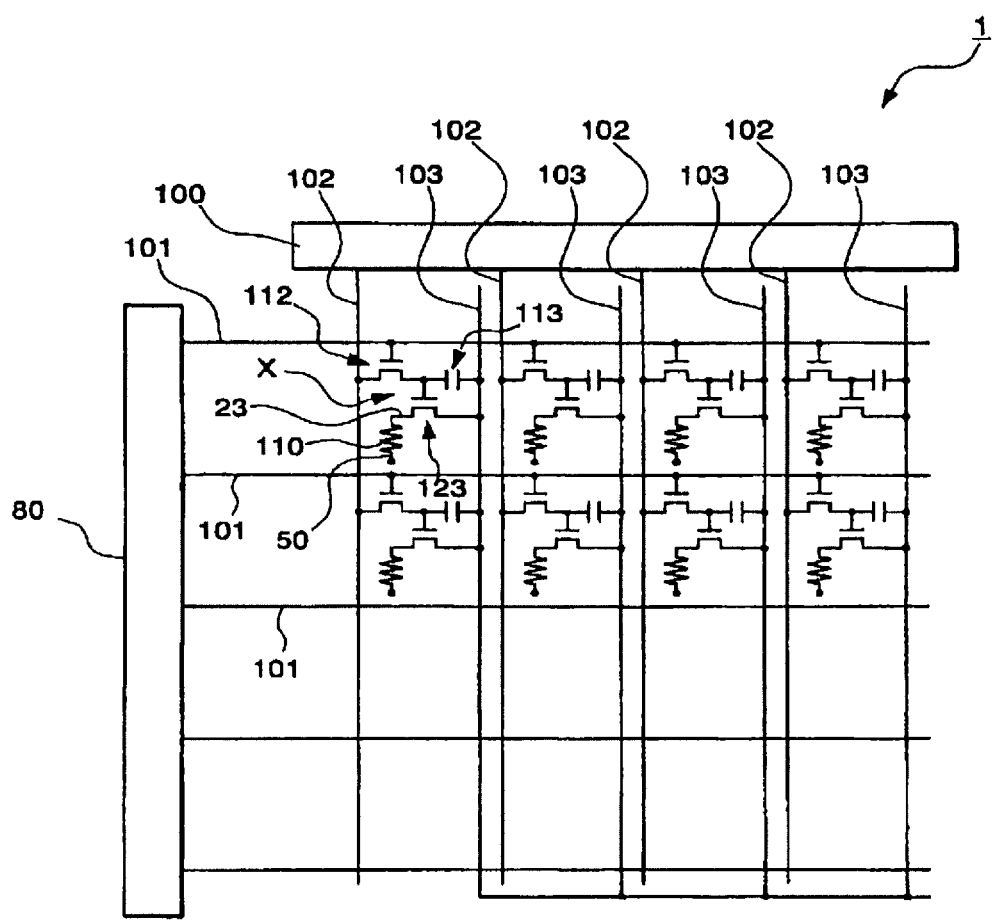
FIG. 1 is a schematic view showing a wiring diagram according to the EL display of the present invention.

Referring to FIG. 1, a wiring structure of an EL display according to the embodiment is described. An EL display 1 (electro-optical device) is an active matrix EL display including thin film transistors (TFTs) as switching elements. As shown in FIG. 1, this EL display 1 can include a plurality of scanning lines 101, a plurality of signal lines 102 that are disposed perpendicular to the scanning lines 101, and a plurality of power supply lines 103 that are disposed parallel to the signal lines 102. Pixel-areas X are provided in the vicinity of respective intersections of the scanning lines 101 and the signal lines 102.

The signal lines 102 are connected to a data line driving circuit 100 including a shift register, a level shifter, a video line, and an analog switch. The scanning lines 101 are connected to a scanning-line-driving circuit 80 including the shift register and the level shifter.

Each of pixel areas X is provided with a switching TFT 112 having a gate electrode to which a scanning signal is supplied through the corresponding scanning line 101, a storage capacitor 113 retaining a shared pixel signal from the corresponding signal line 102 via the switching TFT 112, a driving TFT 123 having a gate electrode to which the pixel signal retained in the storage capacitor 113 is supplied, a pixel electrode 23 into which a driving current flows from the power source line 103 when the pixel electrode is electrically coupled to the corresponding power source line 103 via the driving TFT 123, and a functional layer 110 disposed between the pixel electrode 23 and a cathode 50. The pixel electrode 23, the cathode 50, and the functional layer 110 define a luminescent element (organic EL element).

According to the EL display 1, driving a scanning line 101 allows respective switching TFTs 112 to be in an ON mode, and the potential of the signal lines 102 at this time is stored in the storage capacitors 113. An ON or an OFF mode of the driving TFTs 123 is determined based on the state of the storage capacitors 113. Then a current passes from the power source lines 103 to the pixel electrodes 23 via channels of the driving TFTs 123 and through the cathode 50 via the functional layers 110. The functional layers 110 emit light in accordance with current flowing in the functional layers 110.

Referring to FIGS. 2 to 5, a structure of the EL display 1 according to the embodiment is described.

Figure 2:
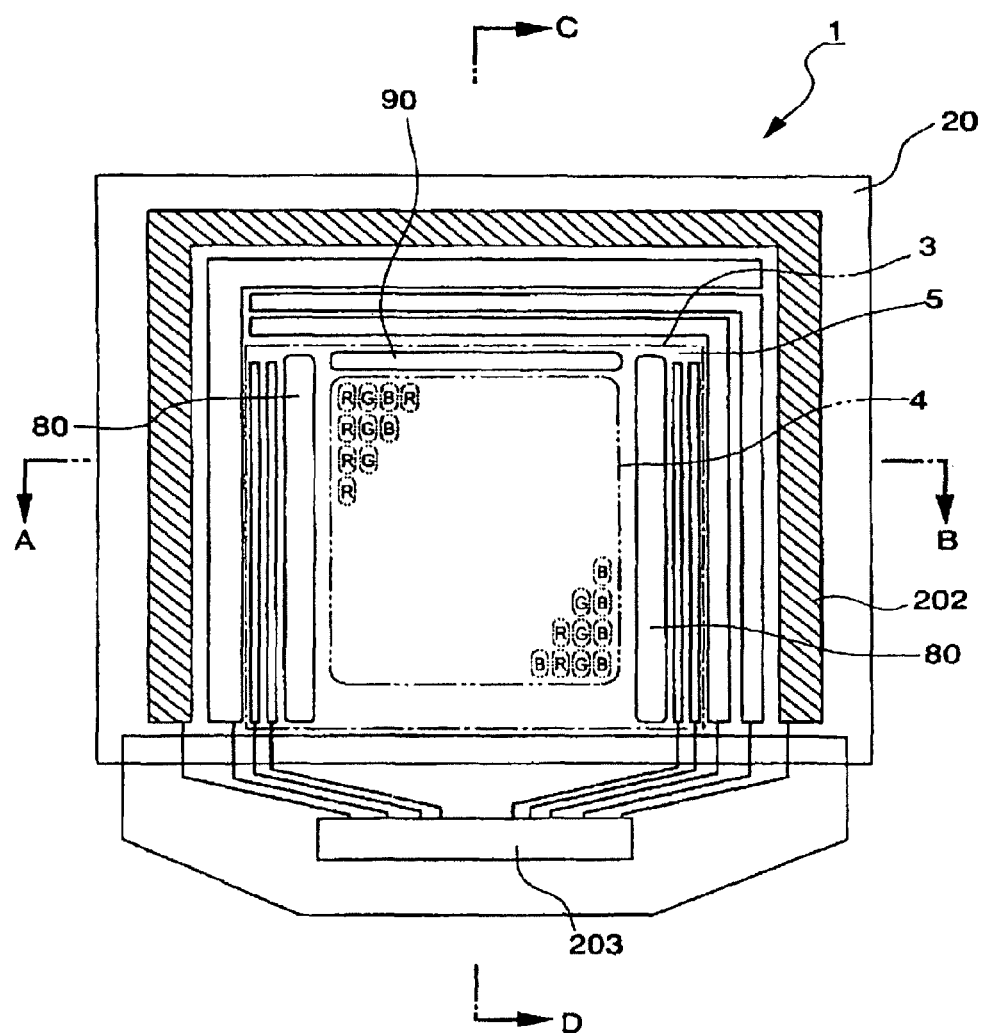
FIG. 2 is a plan view showing typical structure according to the EL display of the present invention.

As shown in FIG. 2, the EL display 1 according to the embodiment is an active matrix display provided with an insulating substrate 20. A pixel electrode region (not shown) includes pixel electrodes connected to switching TFTs (not shown) and arrayed into a matrix on the substrate 20. Power source lines (not shown) are disposed around the region including the pixel electrodes and are connected to the respective pixel electrodes. A pixel area 3 (within alternate long and short dashed lines in FIG. 2) that is substantially rectangular in plan view is located at least on the region including the pixel electrodes. According to the present invention, the substrate 20, as described in greater detail below, including the switching TFTs, various circuits, and interlayer insulators and others formed on the substrate is referred to as a base body (shown as reference numeral 200 in FIGS. 3 and 4).

A pixel area 3 is zoned an actual display area 4 in the center of the pixel area 3 (within alternate long and two short dashes line in FIG. 2) and a dummy area 5 disposed around the actual display area 4 (an area between the alternate long and short dashed lines and the alternate long and two short dashes line).

In an actual display area 4, display areas R, G, and B, each having a pixel electrode, are arrayed into a matrix, at a distance in A-B and C-D directions.

Further, scanning-lines-driving circuits 80 and 80 are disposed on both right and left sides of the actual display area 4 in FIG. 2. These scanning-lines-driving circuits 80 and 80 are disposed under the dummy area 5.

Furthermore, a checking circuit 90 is disposed above the actual display area 4 in FIG. 2. The checking circuit 90 for checking the operating state of the EL display 1 has, for example, means for outputting the results of checking to an external device (not shown) and inspects the defects or quality of displays at the time of shipping or during manufacturing. The checking circuit 90 is also disposed under the dummy area 5.

Driving voltages are applied from a predetermined power supply through a driving-voltage conductive lines 310 (see FIG. 3) and a driving-voltage conductive lines 340 (see FIG. 4) to the scanning-lines-driving circuits 80 and 80 and the checking circuit 90. Driving-control signals and the driving voltages for the scanning-lines-driving circuits 80 and 80 and the checking circuit 90 are sent and applied from a predetermined main driver to control the operation of the EL display 1 through driving-control-signal conduction lines 320 (see FIG. 3) and driving-voltage conduction lines 350 (see FIG. 4). The driving-control signals are defined as command signals from the main driver for controlling output signals from the scanning-lines-driving circuits 80 and 80 and the checking circuit 90.

Figure 3:
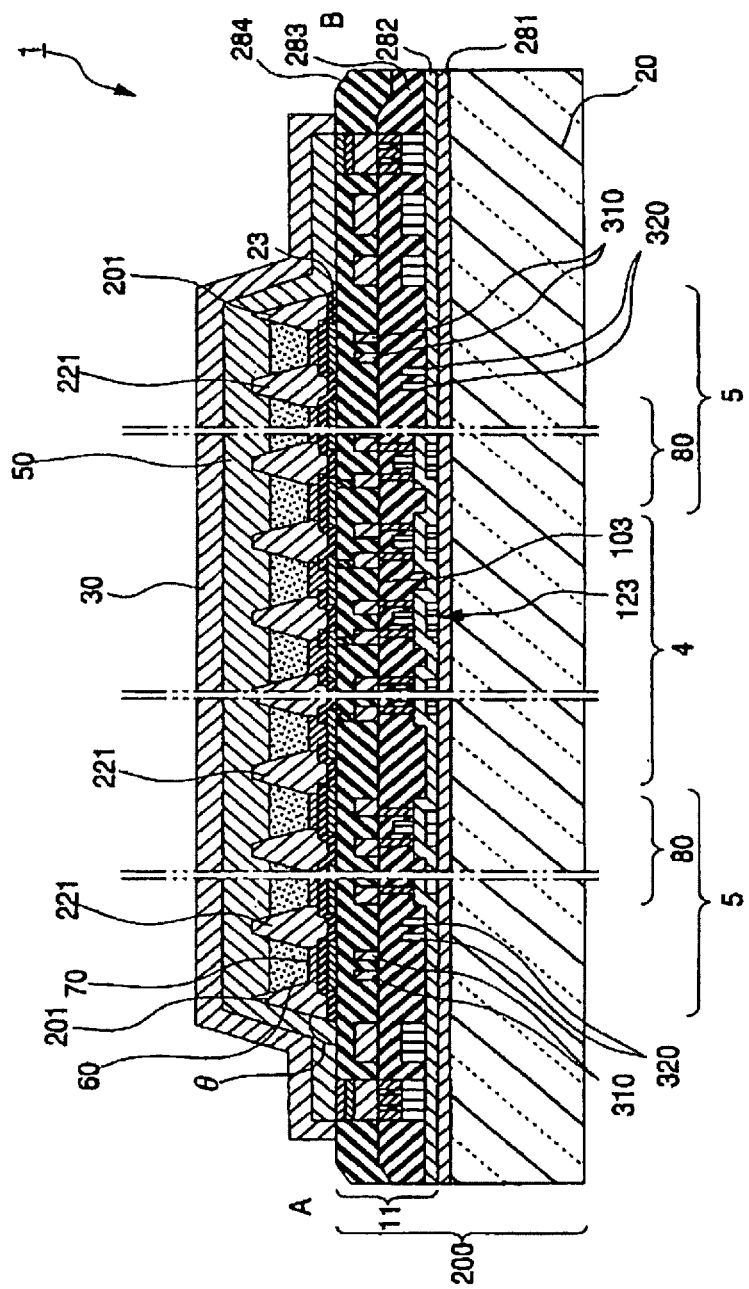
FIG. 3 is a cross-sectional view taken along the line A-B in FIG. 2.
Figure 4:
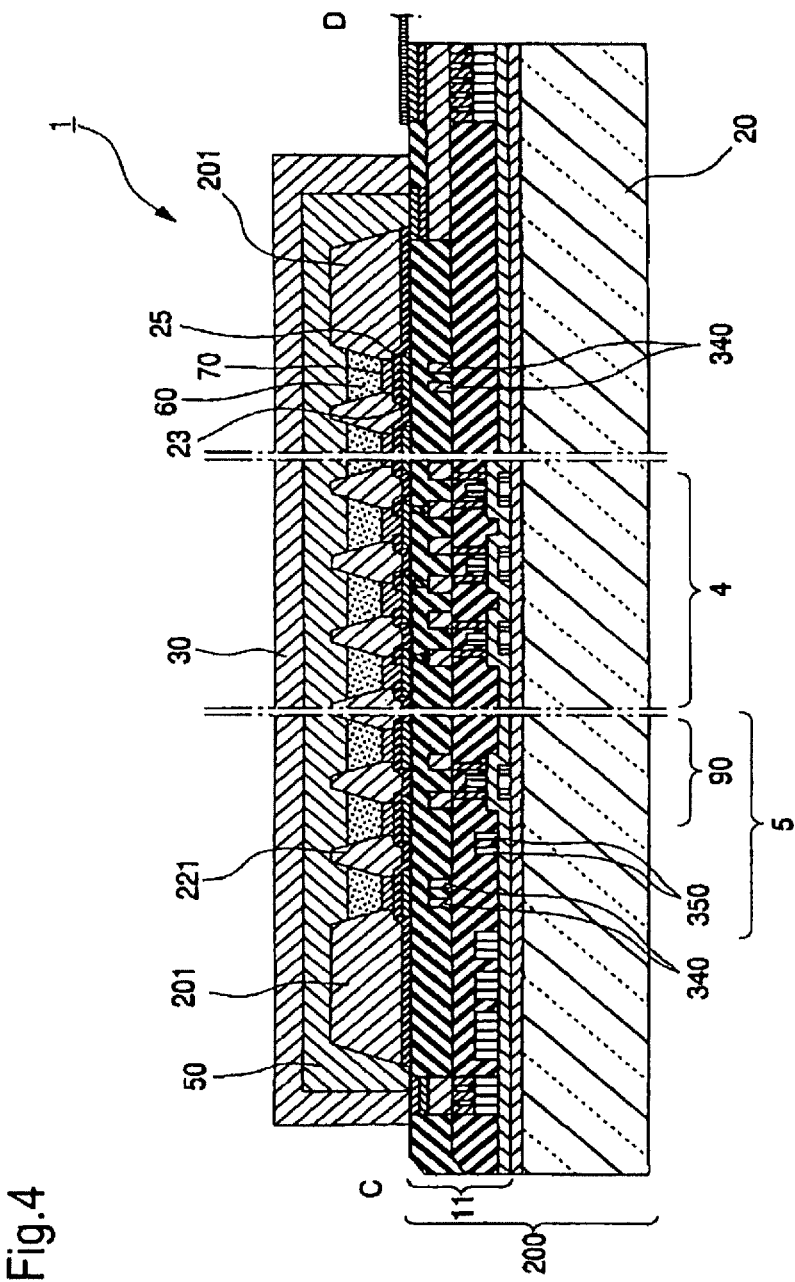
FIG. 4 is a cross-sectional view taken along the line C-D in FIG. 2.

As shown in FIGS. 3 and 4, the EL display 1 can include a plurality of electroluminescent elements (organic EL elements), each being provided with the first electrode (the pixel electrodes 23), luminescent layers 60 defined as functional layers according to the present invention, and the second electrode (the cathode 50) formed on a base body 200. Further, these layers are covered with a gas-barrier layer 30.

According to the embodiment, the functional layers are defined as the luminescent layers 60, and an area composed of the element layers including the functional layers is defined as an elemental area (not shown). The functional layers according to the present invention are typically luminescent layers (electroluminescent layer), and the functional layers may also be defined as carrier injection layers such as hole or electron injection layers, or carrier conduction layers such as hole or electron conduction layers. Furthermore, the functional layers may also be defined as hole or electron blocking layers.

In the case of a top-emission EL display, luminescent light emerges from the gas-barrier layer 30 remote from the substrate 20, hence, the substrate 20 constituting the base body 200 may be a transparent substrate or an opaque substrate.

Materials for the opaque substrate are ceramics, such as alumina, sheets of metals, such as stainless steel, which are subjected to insulation treatment such as surface oxidization, thermosetting or thermoplastic resins, and films (plastic film) of the thermosetting or thermoplastic resins.

In the case of a back-emission EL display, luminescent light emerges from the substrate 20, hence, the substrate 20 may be a transparent substrate or a semitransparent substrate. Materials for the transparent or the semitransparent substrate are, for example, glass, quartz, and resins (plastic or plastic films), in particular, glass is preferably used for the substrate. According to the embodiment, the top-emission EL display emerges luminescent light from the gas-barrier layer 30, hence, the substrate 20 may be the opaque substrate composed of, for example, the opaque plastic film.

Figure 5:
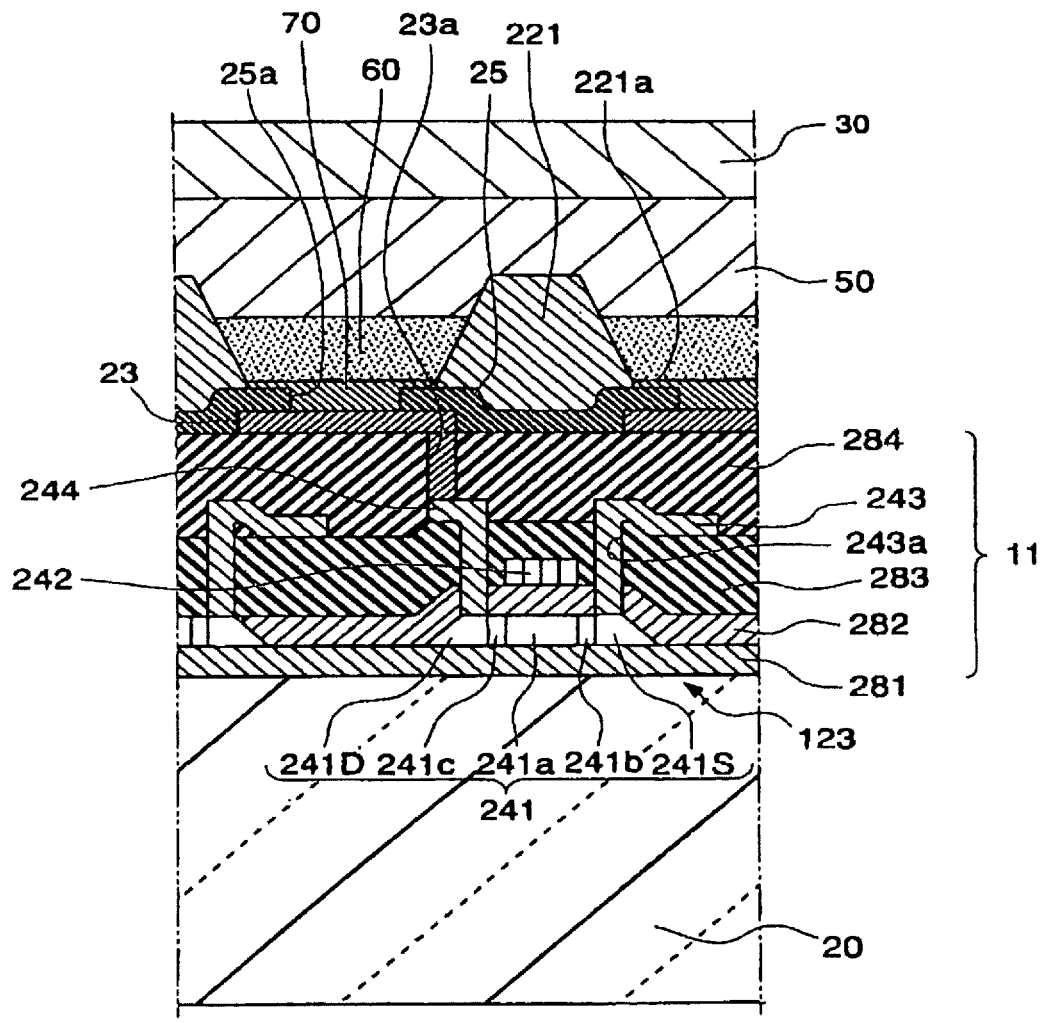
FIG. 5 is an enlarged cross-sectional view of a relevant part of FIG. 3.

A plurality of the luminescent elements (organic electroluminescent elements) are disposed on a circuit section 11 that includes the driving TFTs 123 for driving the pixel electrodes 23 on the substrate 20. As shown in FIG. 5, the luminescent elements can include the pixel electrodes 23 (the first electrodes) functioning as anodes, hole conduction layers 70 that inject or conduct holes from the pixel electrodes 23, the luminescent layers 60 composed of an organic EL material that is an electro-optical material, and the cathode 50 (the second electrode), formed in that order.

Under this structure, recombination of holes injected from the hole conduction layers 70 and electrons injected from cathode 50 in the luminescent layers 60 causes luminescent elements to emit luminescent light.

According to the embodiment, the use of the top-emission EL display does not require transparent electrodes as the pixel electrodes 23, and the pixel electrodes 23 are formed of any suitable conductive material.

Materials forming the hole conduction layers 70 are polythiophene derivatives, polypyrrole derivatives, and doped polythiophene or polypyrrole derivatives. For example, a dispersion liquid of poly(3,4-ethylenedioxythiophene)-poly(styrene sulfonate) (PEDOT/PSS) [trade name; Baytron P: manufactured by Bayer AG] is used, namely poly(3,4-ethylenedioxythiophene) is dispersed in poly(styrene sulfonate) as a dispersion medium, and the dispersion is further dispersed into water.

Materials for forming the luminescent layers 60 may be known luminescent materials that can fluoresce or phosphoresce. Preferably used are, for example, (poly)fluorene (PF) derivatives, (poly)-p-phenylenevinylene (PPV) derivatives, polyphenylene (PP) derivatives, poly-P-phenylene (PPP) derivatives, polyvinylcarbazole (PVK), polythiophene derivatives, and polysilanes, such as polymethylphenylsilane (PMPS).

These polymeric materials may be doped with polymeric pigments such as perylene pigment, coumalin pigment, and rhodamine pigment, or low molecular weight materials such as rubrene, perylene, 9,10-diphenylanthracene, tetraphenylbutadiene, Nile red, coumalin 6, and quinacridone.

These polymeric materials may be replaced with known low-molecular weight materials.

An electron injection layer may be formed on the luminescent layer 60, if necessary.

As shown in FIGS. 3 to 5, according to the embodiment, the hole conduction layers 70 and the luminescent layers 60 are surrounded by lyophilic control layers 25 arrayed into a grid and organic bank layers 221 on the base body 200, hence, the surrounded hole conduction layers 70 and the luminescent layers 60 are defined as element layers forming single luminescent elements (organic EL elements).

According to the present invention, outermost periphery of the lyophilic control layers 25 arrayed into a grid and the organic bank layers 221 on the base body 200 are defined as surrounding sections 201 that cover the outer faces of the outermost periphery of the luminescent layers 60.

Regarding the organic bank layers 221 that are formed on the surrounding sections 201, the angle θ defined by outer faces 201a of the organic bank layers 221 and the base body 200 is 110° or more. By an angle of 110° or more, as described below, the cathode 50 formed on the surrounding sections 201 and the gas-barrier layer 30 formed on the cathode 50 have excellent step coverage, hence, the cathode 50 and the gas-barrier layer 30 on the outer faces 201a of the organic bank layers 221 have high continuity.

As shown in FIGS. 3 to 5, the cathode 50 has a wider area than the sum of that of the actual display area 4 and the dummy area 5, and covers the actual display area 4 and the dummy area 5. The cathode 50 is formed on the base body 200 so as to cover top faces of the luminescent layers 60, the organic bank layers 221, the surrounding sections 201, and the outer faces 201a of the surrounding sections 201. As shown in FIG. 4, the cathode 50 is connected to cathode power supply lines 202 that are formed on the periphery of the base body 200 and outer sides than the outer faces 201a of the surrounding sections 201. The cathode power supply lines 202 are connected to a flexible substrate 203. The cathode 50 is connected to a driving IC (driving circuit) (not shown) formed on the flexible substrate 203 through the cathode power supply lines 202.

According to the embodiment, the top-emission EL display requires a transparent cathode that transmits light, hence, the cathode 50 is composed of a transparent conducting material. The transparent conducting material is preferably indium tin oxide (ITO). In addition, amorphous transparent conductive materials such as indium zinc oxide (IZO; Registered trademark: manufactured by Idemitsu Kosan Co., Ltd.) may also be used. In this embodiment, the transparent conducting material is ITO.

The gas-barrier layer 30 covers exposed areas of the cathode 50 on the base body 200. The gas-barrier layer 30 prevents oxygen or moisture from entering the inner layers, namely, the cathode 50 and the luminescent layers 60. The gas-barrier layer 30 blocks the deterioration of the cathode 50 and the luminescent layers 60 due to oxygen or moisture.

The gas-barrier layer 30, for example, is composed of an inorganic compound and is preferably composed of a silicon compound, such as silicon nitride, silicon oxynitride, or silicon oxide. In addition to the silicon compound, the gas-barrier layer 30 may also be composed of any other ceramic, for example, alumina, tantalum oxide, or titanium oxide. The gas-barrier layer 30 composed of such an inorganic compound has high adhesion to the cathode 50 composed of ITO, hence, the gas-barrier layer 30 becomes a defect-free and dense layer that have an improved barrier property against oxygen or moisture.

The gas-barrier layer 30, for example, may be laminated structure including sublayers composed of different silicon compounds. The gas-barrier layer 30 preferably includes a silicon nitride sublayer and a silicon oxynitride sublayer; or a silicon oxynitride sublayer and a silicon oxide sublayer formed in that order the cathode 50. In addition to these combinations, when the gas-barrier layer 30 includes a plurality of the silicon oxynitride sublayers that have different compositions, the gas-barrier layer 30 preferably has an oxygen concentration which is lower at the bottom sublayer adjacent to the cathode 50 than at the upper layers.

With this structure, oxygen concentration of the cathode 50 side is lower than that of the opposite side. Therefore, this structure can prevent oxygen in the gas-barrier layer 30 from moving through the cathode 50 toward the luminescent layers 60 that are disposed below the cathode 50, and deteriorating the luminescent layer 60. Therefore, this structure can prolong the life of the luminescent layers 60.

In place of the laminated structure, the gas-barrier layer 30 may be composed of a heterogeneous composition that has continuously or discontinuously variable oxygen concentrations. In this case, the gas-barrier layer 30 is preferably has the oxygen concentration which is lower at a face adjacent to the cathode 50 than at the upper face, for the reason described above.

The thickness of the gas-barrier layer 30 is preferably between 10 nm and 500 nm. In the gas-barrier layer 30 having a thickness of less than 10 nm, through holes may be formed by defects in the film or variation in thickness of the film to impair the gas-barrier property. In the case of more than 500 nm, stress cracking may occur.

In this embodiment, the top-emission EL display requires that the gas-barrier layer 30 is transparent. The gas-barrier layer 30 has a transmittance of 80% or more in the visible light region by adjusting the material properties and the film thickness.

As shown in FIG. 5, the circuit 11 is disposed under the luminescent elements. The circuit 11 is formed on the substrate 20 and is included in the base body 200. A substrate protecting layer 281 as a base layer composed principally of silica is formed on the substrate 20. Silicon layers 241 are formed on the substrate protecting layer 281. Gate insulating layers 282 composed principally of silica and/or silicon nitride are formed on the silicon layers 241.

Overlapping areas in the silicon layers 241 right below gate electrodes 242 via the gate insulating layers 282 are defined as channel areas 241a. The gate electrodes 242 are part of the scanning lines 101 (not shown). A first interlayer insulator 283 that is composed principally of silica is formed on the gate insulating layers 282 that covers the silicon layers 241 and the gate electrodes 242 formed on the gate insulating layers 282.

Lightly-doped source areas 241b and heavily-doped source areas 241S are formed in the source side of the channel areas 241a in the silicon layers 241 while lightly-doped drain areas 241c and heavily-doped drain areas 241D are formed in the drain side of the channel areas 241a, resulting in a lightly doped drain (LDD) structure. The heavily-doped source areas 241S are connected to source electrodes 243 through contact holes 243a extending from the gate insulating layers 282 to the first interlayer insulator 283. This source electrodes 243 is part of the power source lines 103 (referring to FIG. 1). In FIG. 5, the power source lines 103 extend the position of the source electrode 243 in the direction perpendicular to the drawing described above. On the other hand, the heavily-doped drain areas 241D are connected to drain electrodes 244, which are composed of the same layer as the source electrodes 243, through contact holes 244a extending from the gate insulating layers 282 to the first interlayer insulator 283. The source electrodes 243 are part of the power source lines 103.

The surface of the first interlayer insulator 283 having the source electrodes 243 and the drain electrodes 244 is covered with a second interlayer insulator 284 composed principally of an acrylic resin, for example. The second interlayer insulator 284 may also be composed of silicon nitride or silica instead of the acrylic resin. The pixel electrodes 23 composed of ITO are formed on the surface of the second interlayer insulator 284 and are connected to the drain electrodes 244 via contact holes 23a disposed in the second interlayer insulator 284. As a result, the pixel electrodes 23 are connected to the heavily-doped drain areas 241D in the silicon layers 241 via the drain electrodes 244.

The thin film transistors (TFTs for driving circuits) included in the scanning-lines-driving circuits 80 and 80 and the checking circuit 90, namely N-channel or P-channel TFTs, for example, constituting a inverter included in a shift resistor among the driving circuits have a similar structure to the driving TFTs 123 except for being not connected to the pixel electrodes 23.

The pixel electrodes 23, the lyophilic control layers 25, and organic bank layers 221 are formed on the surface of the second interlayer insulator 284. The lyophilic control layers 25 are composed of lyophilic materials, such as silica as the major component. The organic bank layers 221 are composed of an acrylic resin or a polyimide resin. Opening sections 25a provided in the lyophilic control layers 25, hole conduction layers 70 and luminescent layers 60 inside the bank openings 221a surrounded the organic bank layers 221 are formed in that order on the pixel electrodes 23. The term "lyophilic" in this embodiment refers to having higher lyophilicity than other materials, such as an acrylic resin or a polyimide resin constituting the organic bank layers 221.

As described above, the circuit 11 is composed of layers up to the second interlayer insulator 284 on the substrate 20.

In the EL display 1 according to the embodiment, each of the luminescent layers 60 can be formed such that luminescent wavelength bands of the luminescent layers 60 correspond to three primary colors of light in order to display color images. For example, display areas R, G, B include the luminescent layers 60, i.e., red-luminescent layers 60R corresponding to red, green-luminescent layers 60G corresponding to green, and blue-luminescent layers 60B corresponding to blue, respectively, in luminescent wavelength bands. A single pixel element displaying color images is composed of these display areas R, G, B. In boundaries of each color-display areas, black matrix (BM) layers (not shown) that are deposited by sputtering of metal chromium are formed, for example, between the organic bank layers 221 and the lyophilic control layers 25.

Referring to FIGS. 6 to 10, typical method for manufacturing the EL display 1 according to the embodiment is described. According to the embodiment, a top-emission EL display 1, as electro-optical device, is described. Each cross-sectional view shown in FIGS. 6 to 10 is taken along line A-B in FIG. 2.

Figure 6A:
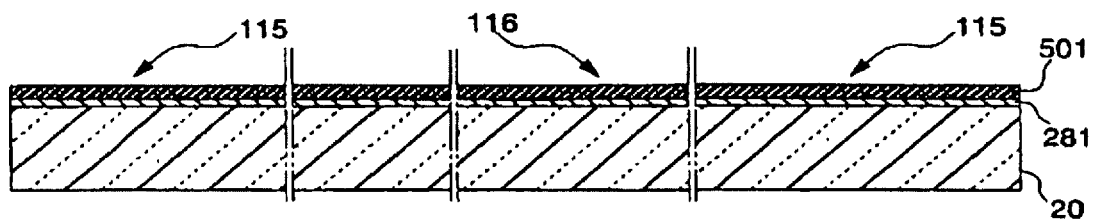
FIGS. 6A to 6D are cross-sectional views describing a method for manufacturing EL display in process order.

As shown in FIG. 6(a), the substrate protecting layer 281 is formed on the surface of the substrate 20. An amorphous silicon layer 501 is deposited by an ICVD method or a plasma CVD method on the substrate protecting layer 281 and then crystal grains are grown by a laser annealing method or rapid thermal processing to form a polysilicon layer.

Figure 6B:
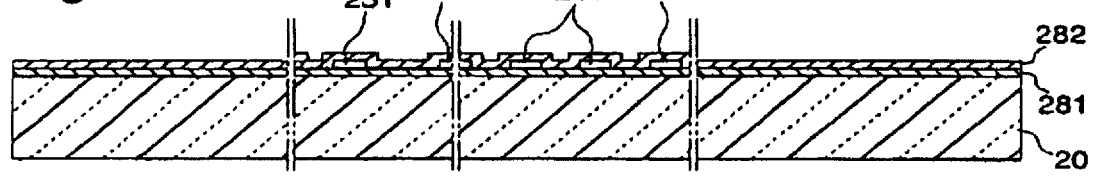

As shown in FIG. 6(b), the polysilicon layer is patterned by photolithography to form island silicon layers 241, 251, and 261. The silicon layers 241 are formed within the display area to form the driving TFT 123 connected to pixel electrodes 23. The silicon layers 251 and 261 constitute P-channel and N-channel TFTs (TFTs for driving circuits) included in scanning-lines-driving circuits 80.

Then, the gate insulating layers 282 of silicon oxide layers with a thickness of about 30 to 200 nm are formed over the entire surface of the silicon layers 241, 251, 261, and the substrate protective layer 281 by plasma CVD or thermal oxidation. During forming the gate insulating layers 282 by thermal oxidation, the silicon layers 241, 251, and 261 are crystallized to form polysilicon layers.

In the case of channel doping to the silicon layers 241, 251, and 261, boron ions are implanted with a dose of $1\times10^{12}$ cm$^2$ to form lightly-doped P-type silicon layers that have an impurity concentration about $1\times10^{17}$ cm$^3$ (calculated by impurities after activating annealing).

Figure 6C:
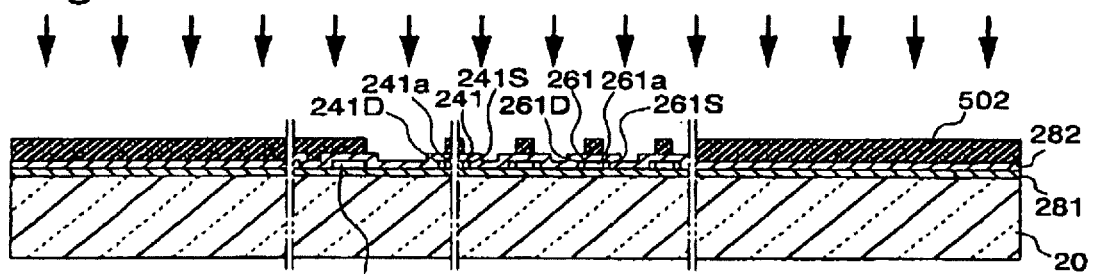

A mask for selective ion implantation is formed on part of channel layers of the P-channel TFTs and N-channel TFTs, then phosphorus ions are implanted with a dose of $1\times10^{15}$ cm$^2$. As shown in FIG. 6(c), impurities are heavily implanted into the patterning mask by selfalignment to form the heavily-doped source areas 241S, heavily-doped source areas 261S, the heavily-doped drain areas 241D, and heavily-doped drain areas 261D in the silicon layers 241 and 261.

Figure 6D:
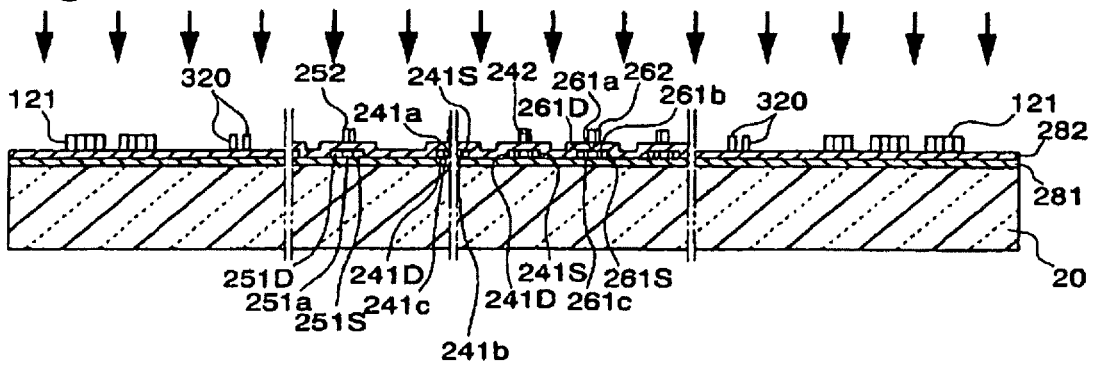

As shown in FIG. 6(c), each conductive layer 502 for forming gate electrodes is formed of a doped silicon film, a silicide film, or metal film made of aluminum, chromium, or tantalum over the entire surface of the corresponding gate insulating layer 282. The conductive layers 502 have a thickness of about 500 nm. As shown in FIG. 6(d), gate electrodes 252 to form P-channel TFTs for driving circuits, gate electrodes 242 to form pixel TFTs, and gate electrodes 262 to form N-channel TFTs for driving circuits are formed by a patterning method. The driving-control-signal lines 320 (350) and a first layer 121 of cathode power supply lines 202 are formed at the same time. In this case, the driving-control-signal lines 320 (350) are disposed in the dummy area 5.

As shown in FIG. 6(d), the gate electrodes 242, 252 262 are used as masks, phosphorus ions are implanted with a dose about $4\times10^{13}$ cm$^2$ into the silicon layers 241, 251, and 261. Therefore, impurities are lightly implanted into the gate electrodes 242, 252, and 262 by selfalignment. As shown in FIG. 6(d), the lightly-doped source areas 241b and 261b, the lightly-doped drain areas 241c and 261c are formed in the silicon layers 241 and 261. Lightly-doped-impurity source areas 251S and lightly-doped-impurity drain area 251D are formed in the silicon layers 251.

Figure 7A:
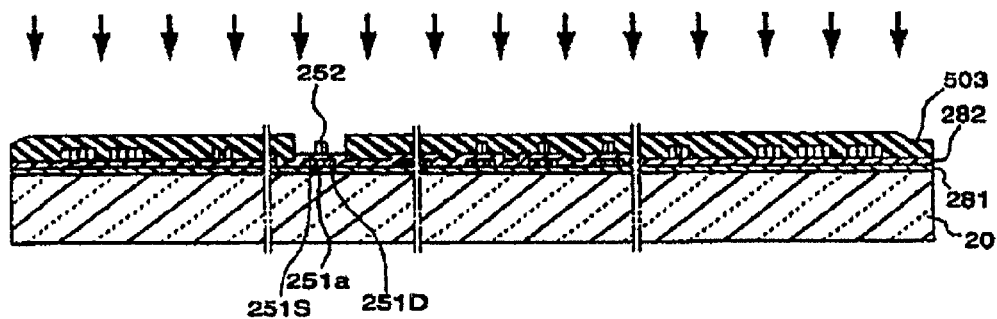
FIGS. 7A to 7C are cross-sectional views describing processes following FIGS. 6A to 6D.

As shown in FIG. 7(a), a mask 503 for selective ion implantation is formed so as to cover the entire substrate except for the gate electrodes 252 to form P-channel TFTs for driving circuits. Boron ions are implanted into silicon layers 251 with a dose of about $1.5\times10^{15}$ cm$^2$ through the mask 503 for selective ion implantation. Because the gate electrodes 252 to form P-channel TFTs for driving circuits function as a mask, impurities are heavily implanted into the gate electrodes 252 to form P-channel TFTs for driving circuits by selfalignment. Therefore, the lightly-doped-impurity source areas 251S and lightly-doped-impurity drain area 251D are counter-doped to form source areas and drain areas of P-channel TFTs for driving circuits.

Figure 7B:
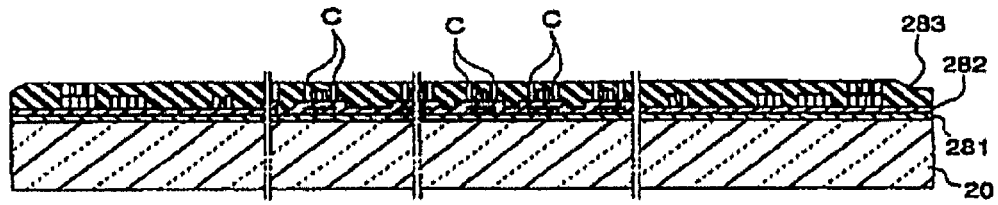

As shown in FIG. 7(b), the first interlayer insulator 283 is formed over the entire substrate 20 and patterned by photolithography to form contact holes C at positions corresponding to source and drain electrodes for each TFT.

Figure 7C:
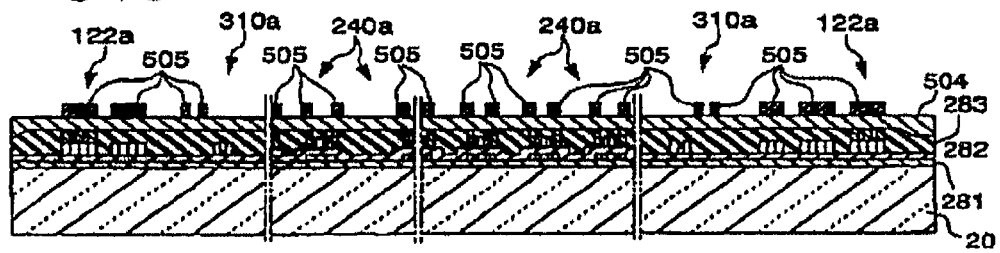

As shown in FIG. 7(c), a conductive layer 504 composed of a metal, for example, aluminum, chromium, and tantalum is formed so as to cover the first interlayer insulator 283. The conductive layer 504 has a thickness of about 200 to 800 nm. Mask layers 505 for patterning are formed on the conductive layer 504 so as to cover areas 240a for forming source and drain electrodes of each TFT, areas 310a for forming the driving-voltage conductive lines 310 (340), and areas 122a for forming a second layer of the cathode power supply lines 202. Then the conductive layer 504 is patterned to form the source electrodes 243, 253, and 263, the drain electrodes 244, 254, and 264 shown in FIG. 8(a).

Figure 8A:
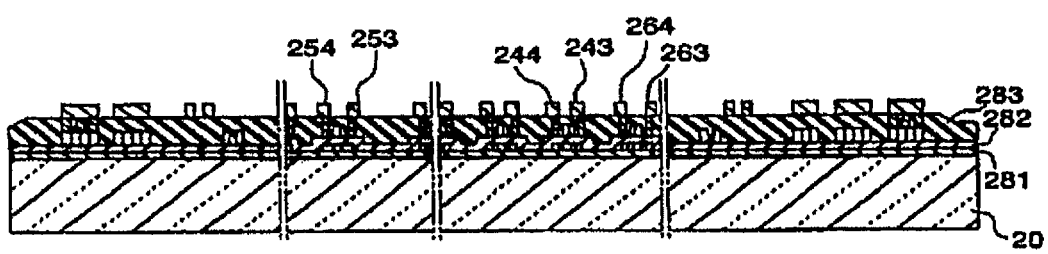
FIGS. 8A to 8C are cross-sectional views describing processes following FIGS. 7A to 7C.
Figure 8B:
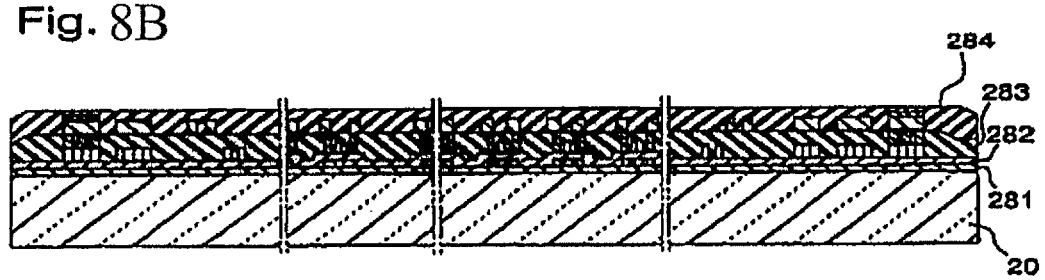

As shown in FIG. 8(b), the second interlayer insulator 284 that covers the first interlayer insulator 283 having these electrodes is formed with polymeric material such as an acrylic resin. The second interlayer insulator 284 preferably has a thickness of about 1 to 2 μm. The second interlayer insulator 284 may also be formed with silicon nitride that preferably has a thickness of 200 nm or silica having a thickness of 800 nm.

Figure 8C:
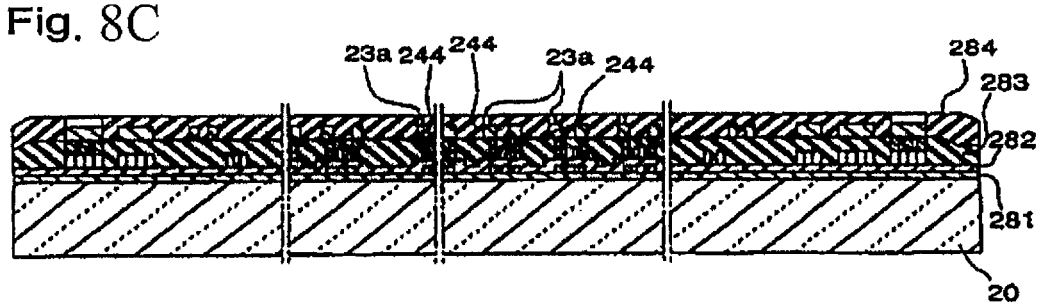

As shown in FIG. 8(c), in the second interlayer insulator 284, positions corresponding to the drain electrodes 244 for driving TFTs are etched to be removed and form contact holes 23a.

A conductive layer to be the pixel electrodes 23 is formed so as to cover the entire substrate 20. As shown in FIG. 9(a), the transparent conductive layer is patterned to form the pixel electrodes 23 connected to the drain electrodes 244 through the contact holes 23a in the second interlayer insulator 284 and dummy patterns 26 in the dummy area. In FIGS. 3 and 4, the pixel electrodes 23 and the dummy patterns 26 collectively referred to as pixel electrodes 23.

The dummy patterns 26 are not connected to lower metal layers via the second interlayer insulator 284. The dummy patterns 26 are arrayed into an island arrangement and have substantially the same shape as that of the pixel electrodes 23 formed in the actual display area. The dummy patterns 26 may also be different from the arrangement of the pixel electrodes 23 formed in the actual display area. In this case, the dummy patterns 26 at least include dummy patterns formed above the driving-voltage conductive lines 310 (340).

As shown in FIG. 9(b), the lyophilic control layers 25, which are insulating layers, are formed on the pixel electrodes 23, the dummy patterns 26, and the second interlayer insulator. In addition, the lyophilic control layers 25 are partly open on the pixel electrodes 23, allowing holes to move from the pixel electrodes 23 through the opening sections 25a (see FIG. 3). On the dummy patterns 26 not having the opening sections 25a, the lyophilic control layers 25, which are insulating layers, function as hole-conduction-blocking layers, hence, holes can not move. In the lyophilic control layers 25, BM layers (not shown) are formed in concave areas between two different pixel electrodes 23, specifically, BM layers are formed on the concave areas of the lyophilic control layers 25 by sputtering with metal chromium.

As shown in FIG. 9(c), the organic bank layers 221 are formed on predetermined positions of the lyophilic control layers 25, in particular, so as to cover the BM layers. Specifically, in a method for forming the organic bank layers, a solution containing a resist such as an acrylic resin or a polyimide resin in a solvent is applied by any application method, for example, spin-coating or dip-coating, to form organic layers. Any organic material that is insoluble in a solvent for ink described below and is easily patterned by etching or the like may be used for the material for forming the organic layers.

The organic layers are patterned by photolithography or etching to form bank openings 221a in the organic layers for forming the organic bank layers 221 having side walls facing to the bank openings 221a. In particular, the outermost peripheries of the organic bank layers 221, namely, outer faces 201a of the surrounding sections 201 according to the present invention described above, preferably have an angle θ defined by the outer faces 201a and the base body 200 is 110° or more. This angle allows the cathode 50 formed on the surrounding sections 201 and the gas-barrier layer 30 formed on the cathode 50 to have good step coverage.

In this case, the organic bank layers 221 at least include organic bank layers formed above the driving-control-signal lines 320.

Lyophilic areas and lyophobic areas are formed on the organic bank layers 221. According to the embodiment, each of these areas is formed by plasma treatment. Specifically, the plasma treatment includes a step of preheating; a step of enhancing ink affinity by modifying the surfaces of the organic bank layers 221, the wall faces of the bank openings 221a, electrode faces 23c of the pixel electrodes 23, and the top surfaces of the lyophilic control layers 25 to lyophilic properties; a step of enhancing ink repellency by modifying the top surfaces of the organic bank layers 221 and the walls of the bank openings 221a to lyophobic properties; and a step of cooling.

The substrate (the substrate 20 including bank and the like) is heated at a predetermined temperature, for example, about 70 to 80° C. and, in the ink affinity enhancing step, the substrate is treated by plasma (oxygen plasma treatment) using oxygen as a reactive gas in the atmosphere. Then, in the ink repellency enhancing step, the substrate is treated by plasma (tetrafluoromethane plasma treatment) using tetrafluoromethane as a reactive gas in the atmosphere, and the substrate heated during plasma treating is cooled to a room temperature. The steps impart lyophilicity and lyophobicity to predetermined areas.

Although electrode faces 23c of the pixel electrodes 23 and the lyophilic control layers 25 are affected somewhat by tetrafluoromethane plasma treatment, ITO that is the material for the pixel electrodes 23 and silica and titanium dioxide that are materials for the lyophilic control layers 25 have poor affinity to fluorine. Thus, hydroxyl groups imparted by the ink affinity enhancing step are not substituted for fluorine, and lyophilicity is maintained.

The hole conduction layers 70 are formed by a step of forming the hole conduction layers. In the step of forming the hole conduction layers, material for hole conduction layers is applied on the electrode faces 23c by a spin-coating method or a droplet discharging method such as an ink-jet method followed by drying and heat treatment to form the hole conduction layers 70 on the pixel electrodes 23. In the case of selective application of the material for the hole conduction layers by, for example, an ink-jet method, an ink-jet head (not shown) is filled with the material for the hole conduction layers and a discharging nozzle of the ink-jet head is opposed to the electrode faces 23c disposed in the opening sections 25a formed on the lyophilic control layers 25. Droplets whose amount per single droplet is controlled are discharged from the discharging nozzle to the electrode faces 23c, while the ink-jet head and the substrate (the substrate 20) are relatively moved.

Drying treatment for the discharged droplets evaporates the dispersion medium or solvent in the material for the hole conduction layers to form the hole conduction layers 70.

The droplets discharged from the discharging nozzle spread over the lyophilic electrode faces 23 and enter the opening sections 25a on the lyophilic control layers 25. The droplets repel from the top faces of the organic bank layers 221 that have ink repellency without adhesion. When the droplets are discharged onto areas that are not predetermined of the top faces of the organic bank layers 221, the droplets are repelled from the top faces, entering the opening sections 25a on the lyophilic control layers 25.

Steps after the step of forming the hole conduction layers are preferably performed in inert gas such as nitrogen or argon in order to prevent the hole conduction layers 70 and the luminescent layers 60 from being oxidized.

The luminescent layers 60 are formed by the step of forming the luminescent layers. In the step of forming the luminescent layers, the material for forming the luminescent layers is discharged onto the hole conduction layers 70 by, for example, an ink-jet method followed by drying and heat treating, for forming the luminescent layers 60 in the bank openings 221*a* formed in the organic bank layers 221. In the step of forming the luminescent layers, solvents used as the material for forming the luminescent layers are nonpolar solvents that not dissolve the material composing the hole conduction layers 70 in order to prevent redissolution of the hole conduction layers 70.

In the step of forming the luminescent layers, for example, materials for the luminescent layers to emit blue (B) light are selectively applied on the display areas for blue light by the ink-jet method and dried. Similarly, the materials to emit green (G) light and red (R) light are selectively applied on the display areas for green and red areas, respectively, and dried.

As described above, an electron injection layers may be formed on the luminescent layer 60, if necessary.

Figure 10A:
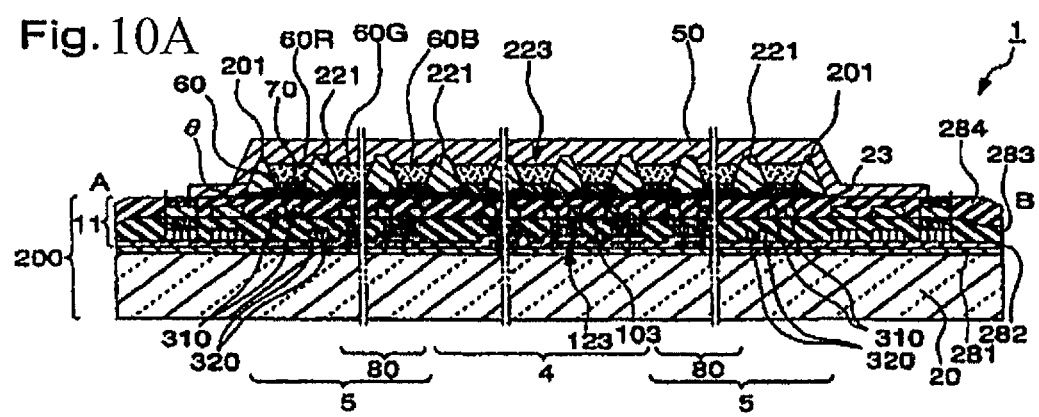
FIGS. 10A to 10B are cross-sectional views describing processes following FIGS. 9A to 9C.
Figure 10B:
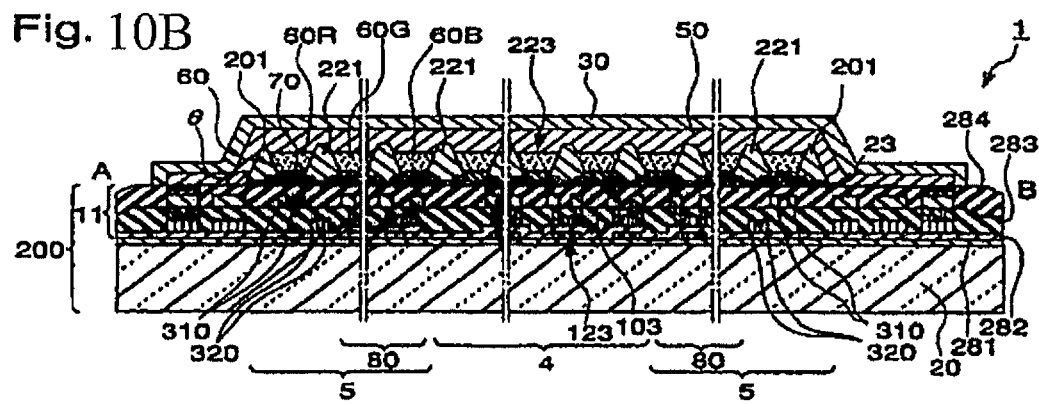

As shown in FIG. 10(*a*), the cathode 50 is formed by the step of forming the cathode layer. The cathode 50 can be composed of ITO formed by physical vapor deposition such as vapor deposition. The cathode 50 is formed so as to cover not only the top of the luminescent layers 60, the organic bank layers 221, and the surrounding sections 201, but also the outer faces 201*a* of the surrounding sections 201.

As shown in FIG. 10(*b*), the gas-barrier layer 30 is formed so as to cover the entire cathode 50 exposed on the base body 200, constituting the EL display (electro-optical device) according to the present invention. The gas-barrier layer 30 is preferably formed by physical vapor deposition, such as sputtering or ion plating, and then by chemical vapor deposition, such as plasma chemical vapor deposition (CVD). The physical vapor deposition such as sputtering or ion plating generally provides a film having relatively high adhesion even to a surface of a different composition, but has the drawbacks that the provided film is granular, is liable to cause defects, and is liable to become highly stressed coatings. On the other hand, chemical vapor deposition provides a high-quality film that exhibits low stress, a good step-coverage, reduced defects, and a densed structure, but has poor adhesion or formability to a surface of the substrate of a different composition. For example, a film is formed by physical vapor deposition up to a half or more of the required film thickness; then, the defective film formed by the physical vapor deposition is compensated by chemical vapor deposition; allowing the gas-barrier layer 30 having excellent gas-barrier property (for oxygen or moisture) as an overall film to form in a relatively short time.

The gas-barrier layer 30, as described above, may be composed of a single layer composed of a homogeneous material, a plurality of layers composed of different materials, or a single layer having a composition that continuously or discontinuously varies across the thickness.

In the case of the gas-barrier layer 30 having a laminated structure of a plurality of layers composed of different materials, the inner layer (layers closer to the cathode 50) formed by physical vapor deposition is preferably composed of silicon nitride or silicon oxynitride, whereas the outer layer formed by chemical vapor deposition is preferably composed of silicon oxynitride or silicon oxide.

The inner layers is formed by physical vapor deposition, as follows: a small amount of oxygen is supplied into a film-forming device at an initial stage; then, the amount of oxygen supplied is continuously or discontinuously increased; thereby, the gas-barrier layer 30 has an oxygen concentration profile which is lower at a side adjacent to the cathode 50 (inner side) than at the outer side.

The gas-barrier layer 30 may be formed by a single film-forming method. In this case, the gas-barrier layer 30 is preferably formed so as to have an oxygen concentration profile which is lower at a side adjacent to the cathode 50 (inner side), as described above.

In this EL display 1, the surrounding sections 201 cover the outer faces of the outermost periphery of the luminescent layers 60, the cathode 50 covers the outer faces of the surrounding sections 201, and the gas-barrier layer 30 covers the cathode 50 exposed on the base body 200, in particular, the outer faces of the luminescent layers 60 are triply sealed by the surrounding sections 201, the cathode 50, and the gas-barrier layer 30 to surely prevent oxygen and moisture from entering the luminescent layers 60. Thus, the cathode 50 and the luminescent layer 60 are protected from the deterioration due to oxygen and moisture to prolong the lifetime of the luminescent elements.

An area of the gas-barrier layer 30 that is in contact with the base body 200 is composed of a silicon compound. Even if the substrate 20 constituting the base body 200 is made of a permeable resin, the entire outsides of the luminescent elements are sealed by the gas-barrier layer 30 and the interlayer insulator formed on the substrate 20 to prolong the lifetime of the luminescent elements.

In the active matrix EL display, the cathode 50 and the gas-barrier layer 30 are not required for each luminescent element, hence, fine patterning is not required for the cathode 50 and the gas-barrier layer 30, and these films may be formed by a simple method with high productivity.

The above-described EL display 1 is the top-emission EL display, however, the present invention is not limited to the embodiment. The present invention is also applicable to a back-emission EL display and an EL display that emits light from both faces. Particularly, the back-emission EL display does not require a transparent electrode as the cathode 50. In such case, at least the face of the cathode 50 in contact with the gas-barrier layer 30 is preferably composed of an inorganic oxide.

In this case, the face of the cathode 50 in contact with the gas-barrier layer 30 is composed of an inorganic oxide, the cathode 50 has excellent adhesion to the gas-barrier layer 30 composed of an inorganic compound or a silicon compound, hence, the gas-barrier layer 30 is free from defects and is a dense layer that has improved barrier property against oxygen or moisture.

In the case of the back-emission EL display or the EL display that emits light from the both faces, the switching TFTs 112 or the driving TFTs 123 in the base body 200 are formed directly below the lyophilic control layer 25 and the organic bank layers 221, not directly below the luminescent elements, thereby, the aperture ratio is preferably increased.

In this EL display 1, the first electrodes function as anodes and the second electrode functions as cathode according to the present invention. Alternatively, the EL display may have an inverse structure in which the first electrodes function as cathodes and the second electrode functions as anode. In this case, the positions of the luminescent layers 60 and the hole conduction layers 70 must be exchanged.

In the embodiment, the EL display 1 is applied to the electro-optical device according to the present invention, however, it should be understood that the present invention is not limited to the embodiment. The present invention is applicable to any type of electro-optical device as long as the second electrode is basically disposed on the outside of the base body.

In the EL display 1, the gas-barrier layer 30 is the outermost layer and may be sealed by a sealed substrate or a sealing can as conventionally performed.

Figure 11:
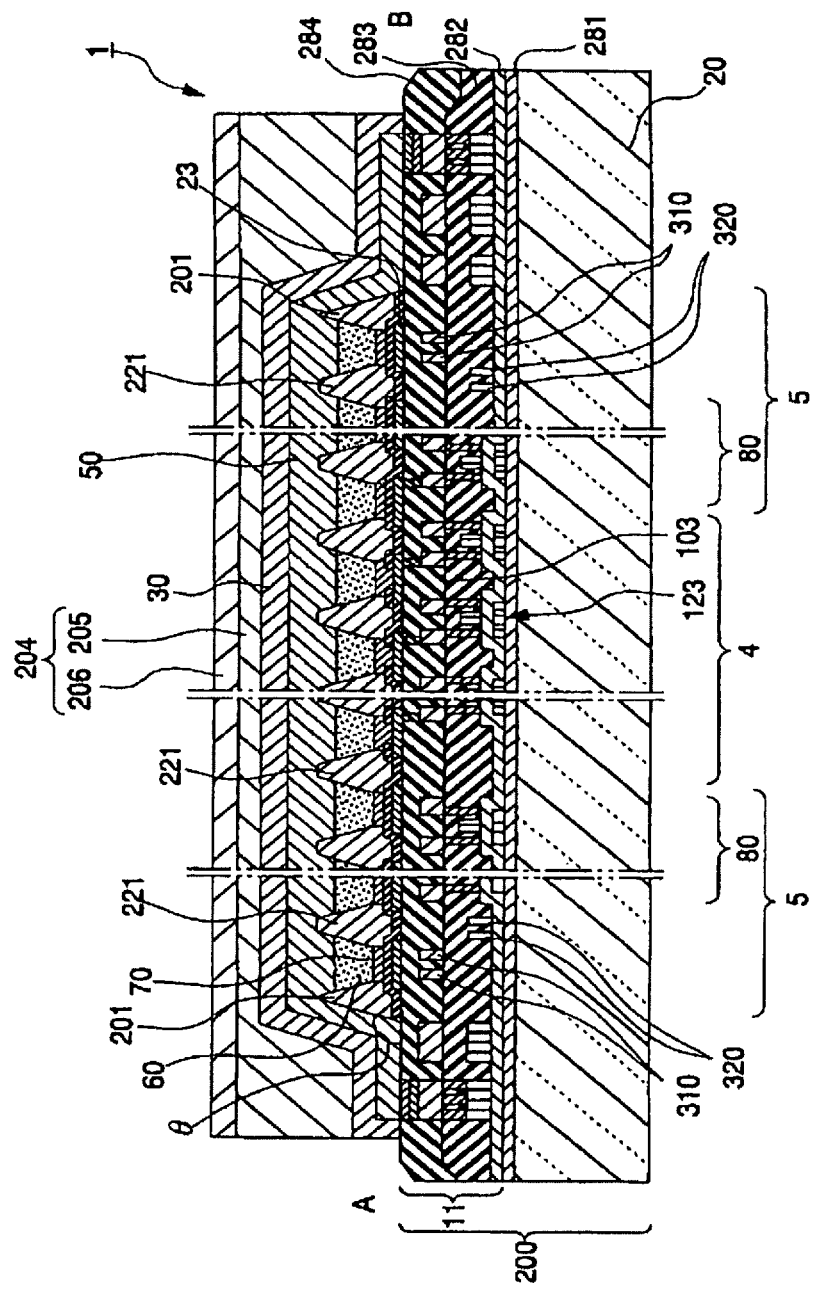
FIG. 11 is an enlarged cross-sectional view of a relevant part of other EL display according to the present invention.

FIG. 11 shows the embodiment in which a protective layer 204 is formed so as to cover the gas-barrier layer 30 as an example of sealing the outside of the gas-barrier layer 30. The protective layer 204, in this embodiment, is composed of a buffer sublayer 205 on the gas-barrier layer 30 and a surface protective sublayer 206 disposed on the buffer layer 205.

The buffer sublayer 205 adheres to the gas-barrier layer 30, can absorb mechanical shock from the outside, and is formed of an adhesive composed of, for example, a urethane resin, an acrylic resin, an epoxy resin, and a polyolefine resin. The adhesive has a low glass transition temperature and is more flexible than the material for the surface protective layer 206. A silane coupling agent or alkoxysilane is preferably added to the adhesive. In this case, the adhesion between the buffer layer 205 and the gas-barrier layer 30 is improved; hence, buffer function against mechanical shock is improved. Particularly, in the case of the gas-barrier layer 30 composed of a silicon compound, adhesion between the gas-barrier layer 30 and the buffer layer 205 is improved by a silane coupling agent or alkoxysilane, hence, the gas-barrier layer 30 has an improved gas-barrier property.

The surface protective layer 206 is formed on the buffer layer 205 to constitute the surface of the protective layer 204 and has at least one function among pressure resistance, wear resistance, anti-reflectivity for external light, a gas-barrier property, and an ultraviolet blocking property. The surface protective layer 206 is composed of a polymeric layer (a plastic film), a diamond-like carbon (DLC) layer, and glass.

In the EL display according to this embodiment, the top-emission EL display requires the transparent surface protective layer 206 and the transparent buffer layer 205. The back-emission EL display, however, does not require.

The protective layer 204 which is provided on the gas-barrier layer 30, can protect the luminescent layers 60, the cathode 50, and the gas-barrier layer; due to pressure resistance, wear resistance, anti-reflectivity for external light, a gas-barrier property, and a ultraviolet blocking property of the surface protective layer 206, hence, the lifetime of the luminescent layers is prolonged.

When the buffer layer receives mechanical shock from the exterior, the buffer layer 205 absorbs the mechanical shock to the gas-barrier layer 30 and the luminescent elements below the gas-barrier layer and can prevent the luminescent elements from deteriorating by the mechanical shock.

Electronic apparatus are described according to the present invention. The electronic apparatus according to the present invention can include the EL display (electro-optical device) as a display. FIG. 12 shows, specific examples of the electronic apparatus.

Figure 12A:
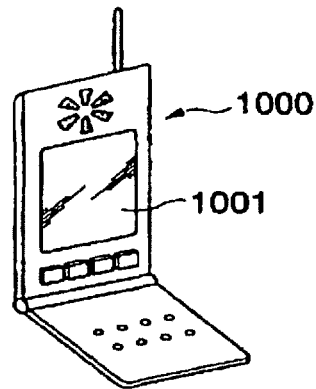
FIGS. 12A to 12C are perspective views showing electronic apparatus according to the present invention.

FIG. 12(a) is a perspective view showing one example of cellular phone. Reference numeral 1000 represents a main body of the cellular phone, and reference numeral 1001 represents a display using the EL display.

Figure 12B:
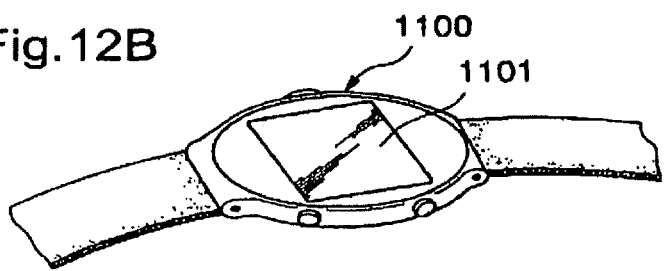

FIG. 12(b) is a perspective view showing one example of electronic apparatus of a wristwatch type. Reference numeral 1100 represents a main body of the wristwatch, and reference numeral 1101 is a display using the EL display.

Figure 12C:
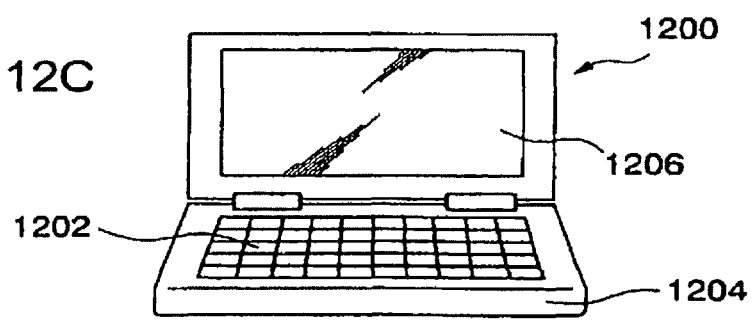

FIG. 12(c) is a perspective view showing one example of a portable information-processing apparatus, such as a word processor or a personal computer. Reference numeral 1200 is an information processing apparatus, reference numeral 1202 is an input device such as key board, reference numeral 1206 is a display using the EL display, and reference numeral 1204 is a main body of the information processing apparatus.

These electronic apparatuses shown in FIGS. 12(a) to 12(c) are provided with the display having the EL display (electro-optical device), hence, the lifetime of the luminescent elements of the EL display constituting the display is prolonged.

The gas-barrier property of the gas-barrier layer according to the present invention was confirmed by the following experiment.

Sample Preparation

Polyethylene terephthalate (PET; trade name [T60] manufactured by TORAY INDUSTRIES, INC. 188 μm in thickness) was used as a substrate. Materials for an electrode and a gas-barrier layer were deposited on the substrate as follows to prepare samples.

Preparation of an Inorganic Oxide Electrode (ITO) (Film-Forming Condition)

A magnetron DC sputtering apparatus was used for the film deposition. Indium tin oxide was used for target material. An ITO film of 100 mu in thickness was formed at a degree of vacuum of 0.4 Pa and in an argon and oxygen atmosphere.

Preparation of a Metal Electrode (Aluminum) (Film-Forming Condition)

A resistance heating vapor deposition apparatus was used for the film deposition. Highly pure aluminum was used as a material. An aluminum film of 25 nm in thickness was formed at a degree of vacuum of $1\times10^{-5}$ Pa.

Preparation of Silicon Compounds (Silicon Mono/Dioxide (SiOx), Silicon Nitrides (SiNx), and Silicon Oxynitrides (SiOxNy)) as a Gas-Barrier Layer (Film-Forming Condition)

An electron cyclotron resonance (ECR) system was used for the film deposition. Silicon was used as a target material. A silicon compound film of 10 to 150 nm in thickness was formed at degree of vacuum of 0.2 Pa in an argon, an oxygen, and a nitrogen atmosphere. The type and the flow rate of the gas introduced were selected for each sample.

Measurement

Samples were examined for moisture permeability according to JIS-Z0208. The measurements (measured values) are shown as follows. Unit of the moisture permeability is $g/m^2 \cdot 24$ hours. Measurements were performed at 60° C. and 90% RH. An untreated substrate and a substrate provided with only a film of an electrode material were also examined for moisture permeability for reference, the results are shown below. The moisture permeability of films composed of only silicon compounds was calculated (converted) from the following equation. The results are also shown as reference values.

Conversion for the film composed of silicon compounds.

$$(1/A)=(1/B)+(1/C)$$

wherein

A; measured values of (PET or PRT+ITO film)+silicon compounds film;

B; measured values of (PET or PRT+ITO film); and

C; calculated (converted) values of the films composed of silicon compounds.

| sample composition | moisture permittivity measured value | film composed of silicon compounds |
|---|---|---|
| PET/ITO/SiOx (film thickness is 70 nm) | 0.04 | 0.04 |
| PET/ITO/SiNx (film thickness is 40 nm) | 0.21 | 0.23 |
| PET/ITO/SiOxNy (film thickness is 40 nm) | 0.12 | 0.12 |

-continued

| sample composition | moisture permittivity measured value | film composed of silicon compounds |
|---|---|---|
| PET/SiOx (film thickness is 70 nm) | 1.76 | 2.18 |
| PET/SiNx (film thickness is 40 nm) | 0.45 | 0.47 |
| PET/SiOxNy (film thickness is 40 nm) | 0.29 | 0.30 |
| PET/Al/SiOx | 0.41 | 0.81 |
| PET | 9.19 | — |
| PET/Al (film thickness is 25 nm) | 0.81 | — |
| PET/ITO (film thickness is 100 nm) | 3.13 | — |

Refractive index of silicon compounds were examined by an automatic ellipsometer NARY-102 (manufactured by FIVE LAB Co., Ltd) at a wavelength of 632 nm, resulting in 1.43 for SiOx, 1.99 for SiNx, and 1.65 for SiOxNy. (The variations in composition of the SiOxNy allows the refractive index to change in any value).

Example 2

Figure 13:
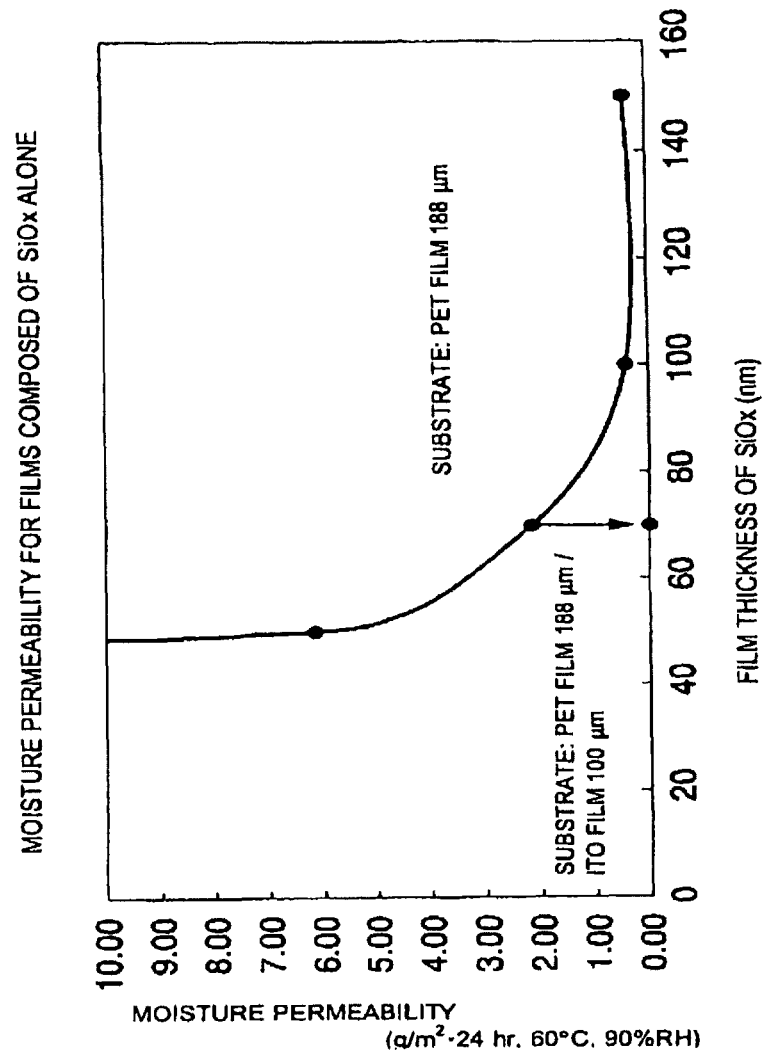
FIG. 13 is a graph showing the thickness dependence of the moisture permeability for silicon compound films.

The moisture permeability was measure as in Example 1 while the thickness of the film of silicon compound was varied to determine the relationship between the film thickness and the moisture permeability. The results are shown below. Not only the measured value of the film composed of silicon compounds (SiOx) which was not formed directly on the substrate (PET), but also the example formed on the ITO layer (film thickness of SiOx is 70 nm) is shown. FIG. 13 is a graph of these results.

| sample composition | moisture permittivity measured value | film composed of silicon compounds |
|---|---|---|
| PET/ITO/SiOx (film thickness is 70 nm) | 0.04 | 0.04 |
| PET/SiOx (film thickness is 10 nm) | 9.14 | 1582.46 |
| PET/SiOx (film thickness is 30 nm) | 8.55 | 121.63 |
| PET/SiOx (film thickness is 50 nm) | 3.68 | 6.14 |
| PET/SiOx (film thickness is 70 nm) | 1.76 | 2.18 |
| PET/SiOx (film thickness is 100 nm) | 0.47 | 0.49 |
| PET/SiOx (film thickness is 150 nm) | 0.45 | 0.47 |

As shown in FIG. 13, the measurements showed that the permeability of the films included in ITO film was significantly lower than the permeability of the films merely composed of silicon compounds (SiOx) on the substrate even if they have the same thickness. This showed that the formation of the films composed of silicon compounds (SiOx) on ITO film, rather than those formed directly on the substrate (PET), caused the film quality to be dense, improving gas-barrier property.

What is claimed is:

1. An electro-optical device, comprising:
    a base that has an actual display area and a dummy area positioned outside the actual display area, the base having a first edge;
    a wiring substrate that is bonded along the first edge and is disposed a wiring;
    a first electrode that is disposed above the base;
    a bank layer that is disposed above the base, the bank layer having an opening corresponding to a position at which the first electrode is formed;
    a second electrode that is disposed above the first electrode and the bank layer;
    a first light emitting layer that is disposed between the first electrode and the second electrode in the actual display area;
    a second light emitting layer that is disposed in the dummy area, the second light emitting layer being covered with the second electrode; and
    a surrounding section that is disposed above the base in the dummy area, the surrounding section being positioned outside the bank layer and the second light emitting layer; and
    a gas barrier layer that is disposed on the second electrode, the gas barrier layer covering the actual display area and the dummy area, the gas battier layer being formed such that the gas barrier layer reaches a peripheral area outside the surrounding section,
    the second electrode being configured to:
        i) cover the actual display area and the dummy area, and
        ii) reach the peripheral area,
    an edge of the gas barrier layer contacting with the base at the peripheral area and not contacting with the wiring at the first edge.

2. An electro-optical device according to claim 1,
    the base having an insulating layer in the actual display area, the dummy area, and the peripheral area, and
    the edge of the gas barrier layer contacting with the insulating layer at the peripheral area.

3. An electronic apparatus comprising an electro-optical device according to claim.

4. An electro-optical device according to claim 1, further comprising:
    a wiring for the second electrode that is disposed at the outer side of the surrounding section, wherein
    the wiring for the second electrode is electrically connected to the second electrode at the outer side of the surrounding section.

5. An electro-optical device according to claim 4, wherein the wiring for the second electrode is formed at an outer peripheral portion of the base.

6. An electro-optical device according to claim 5, further comprising:
    a protective portion arranged on the opposite side of the second electrode as the first electrode, wherein
    the gas barrier layer is positioned between the protective portion and the second electrode.

7. An electronic apparatus comprising an electro-optical device according to claim 6.

8. An electronic apparatus comprising an electro-optical device according to claim 5.

9. An electro-optical device according to claim 4, further comprising:
    a protective portion arranged on the opposite side of the second electrode as the first electrode, wherein
    the gas barrier layer is positioned between the protective portion and the second electrode.

10. An electronic apparatus comprising an electro-optical device according to claim 9.

11. An electronic apparatus comprising an electro-optical device according to claim 4.

12. An electro-optical device according to claim 4, further comprising:

an interlayer insulating film disposed between the second electrode and the wiring for the second electrode, wherein the second electrode and the wiring for the second electrode are electrically connected via an opening formed in the interlayer insulating film.

13. An electro-optical device according to claim 1, further comprising:

a protective portion arranged on the opposite side of the second electrode as the first electrode, wherein the gas barrier layer is positioned between the protective portion and the second electrode.

14. An electronic apparatus comprising an electro-optical device according to claim 13.

15. An electronic apparatus comprising an electro-optical device according to claim 1.

16. An electro-optical device according to claim 1, wherein the gas barrier layer covers an entire surface of the second electrode, extending to an outer side of the second electrode and contacting the base at the outer side of the second electrode, and the gas barrier layer comprises an inorganic compound.

17. An electro-optical device according to claim 16, wherein a portion of the layer that contacts the base and the second electrode, the layer comprises a silicon compound or a silicon oxide nitride, and at least a surface of the second electrode that contacts the layer comprises an inorganic oxide.

18. An electro-optical device according to claim 1, wherein the gas barrier layer is disposed over an outer side of the second electrode.

19. An electro-optical device according to claim 1, wherein the second electrode and the gas barrier layer are disposed over an outer area of the actual display area and the dummy area.

* * * * *